(12) United States Patent
To et al.

(10) Patent No.: US 7,010,637 B2
(45) Date of Patent: *Mar. 7, 2006

(54) SINGLE-ENDED MEMORY INTERFACE SYSTEM

(75) Inventors: Hing Y To, Folsom, CA (US); James A McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 535 days.

This patent is subject to a terminal disclaimer.

(21) Appl. No.: 10/138,540

(22) Filed: May 2, 2002

(65) Prior Publication Data

US 2003/0208668 A1    Nov. 6, 2003

(51) Int. Cl.
  *G06F 13/00* (2006.01)
  *H03K 19/0948* (2006.01)
(52) U.S. Cl. .................... 710/305; 326/83; 326/86
(58) Field of Classification Search ............... 710/305; 365/226; 326/86, 30, 80, 83; 327/108–109
See application file for complete search history.

(56) References Cited

U.S. PATENT DOCUMENTS

| | | | |
|---|---|---|---|
| 4,864,291 A | * | 9/1989 | Korpi .................... 340/825.5 |
| 5,479,123 A | * | 12/1995 | Gist et al. ................... 327/108 |
| 5,719,525 A | * | 2/1998 | Khoury ..................... 327/562 |
| 5,955,889 A | * | 9/1999 | Taguchi et al. ............... 326/30 |
| 6,323,698 B1 | * | 11/2001 | Fletcher ..................... 327/100 |
| 6,400,176 B1 | * | 6/2002 | Griffin et al. ................. 326/30 |
| 6,438,014 B1 | * | 8/2002 | Funaba et al. ................ 365/63 |
| 6,441,653 B1 | * | 8/2002 | Spurlin ..................... 327/108 |
| 6,466,080 B1 | * | 10/2002 | Kawai et al. ............... 327/538 |
| 6,633,178 B1 | * | 10/2003 | Wilcox et al. ................ 326/30 |
| 6,683,472 B1 | * | 1/2004 | Best et al. .................... 326/30 |
| 6,686,778 B1 | * | 2/2004 | Theogarajan ............... 327/108 |
| 2001/0042216 A1 | * | 11/2001 | Jung et al. .................. 713/300 |

* cited by examiner

*Primary Examiner*—Paul R. Myers
*Assistant Examiner*—Ryan Stiglic
(74) *Attorney, Agent, or Firm*—Pillsbury Winthrop Shaw Pittman LLP

(57) ABSTRACT

A system for interfacing over a multi-drop bus comprising a single-ended control interface coupled with a first power supply, and a common supply and a plurality of single-ended memory interfaces coupled with a second power supply, the common supply and coupled directly to the control interface. The control interface is configured to drive a control output signal and the memory interface is configured to drive a memory output signal. The output signals are driven to the common supply to transfer a logic low.

16 Claims, 11 Drawing Sheets

SINGLE-ENDED MEMORY INTERFACE SYSTEM

RELEVANT FIELD

An embodiment of the invention relates to communication between semiconductor devices and more particularly, to systems for transferring data over a single-ended memory interface.

BACKGROUND INFORMATION

Applications that require memory must interface with the memory in order to store and retrieve data. For instance, in Personal Computers (PCs) and workstations, a central processing unit (CPU) accesses memory by way of a control unit located in a memory control hub (MCH). The control unit communicates with a memory unit by sending and receiving data signals over a bus. If large amounts of memory are required, one or more memory units are placed on a memory module such as a Single In-line Memory Module (SIMM) or a Dual In-line Memory Module (DIMM). The MCH can be placed on the module as well, if not then the modules are connected to an external bus in order to communicate with the MCH.

A multi-drop bus is a typical bus configuration used for interfacing between a memory module and the MCH. In a multi-drop bus architecture, a master device, such as an MCH, communicates over a bus by addressing one or more slave devices, such as a memory unit or memory module. Typically, a multi-drop bus will have one communication port for each coupled memory unit or module. The communication port will generally include address, data, command and side-band pins for communication between the MCH and the memory units or modules. However, the numerous connections on the multi-drop bus create signal reflections within the bus, so effort is required to minimize the reflections, since reflections can impede proper data transfer over the bus.

There are many types of memory units available. One of the more common types of memory unit is a Dynamic Random Access Memory (DRAM) unit, of which there are also many varieties. It is generally a goal to increase the amount of memory in a PC or workstation without increasing the amount of space taken up by the memory. As a result, DRAM units are typically pin-limited or, in other words, the DRAM packaging constraints and size constraints of the environment only allow for external connections to a certain number of DRAM signal pins. Due to the pin limitations, the DRAM units can generally only support a single-ended interface, as opposed to a differential interface. This is because the single-ended interface only requires one external pin connection to transfer a data signal.

Another concern in memory interfaces is power consumption, which grows as the amount of memory in the interface system increases. When devices consume power they generate heat and as the power consumption grows, more hardware is needed to dissipate the heat. This becomes especially difficult as operating frequencies rise.

BRIEF DESCRIPTION OF THE DRAWINGS

The methods and apparatuses described herein will be described with reference to the accompanying drawings, wherein.

The components in the figures are not necessarily to scale, emphasis instead being placed upon illustrating the principles of the invention. In the figures, like reference numerals designate corresponding parts throughout the different views.

DETAILED DESCRIPTION

The systems and methods for a single-ended interface described herein provide for optimal and efficient data transfer between a control unit and multiple memory units. The control unit and each memory unit contain an interface, which drives and receives the data being transferred over the bus. The memory interface system described herein allows the control interface and memory interfaces to operate with independent power supplies. This eliminates performance compromises in each interface that are found in systems in which the control and memory interfaces share a power supply.

Figure 1:
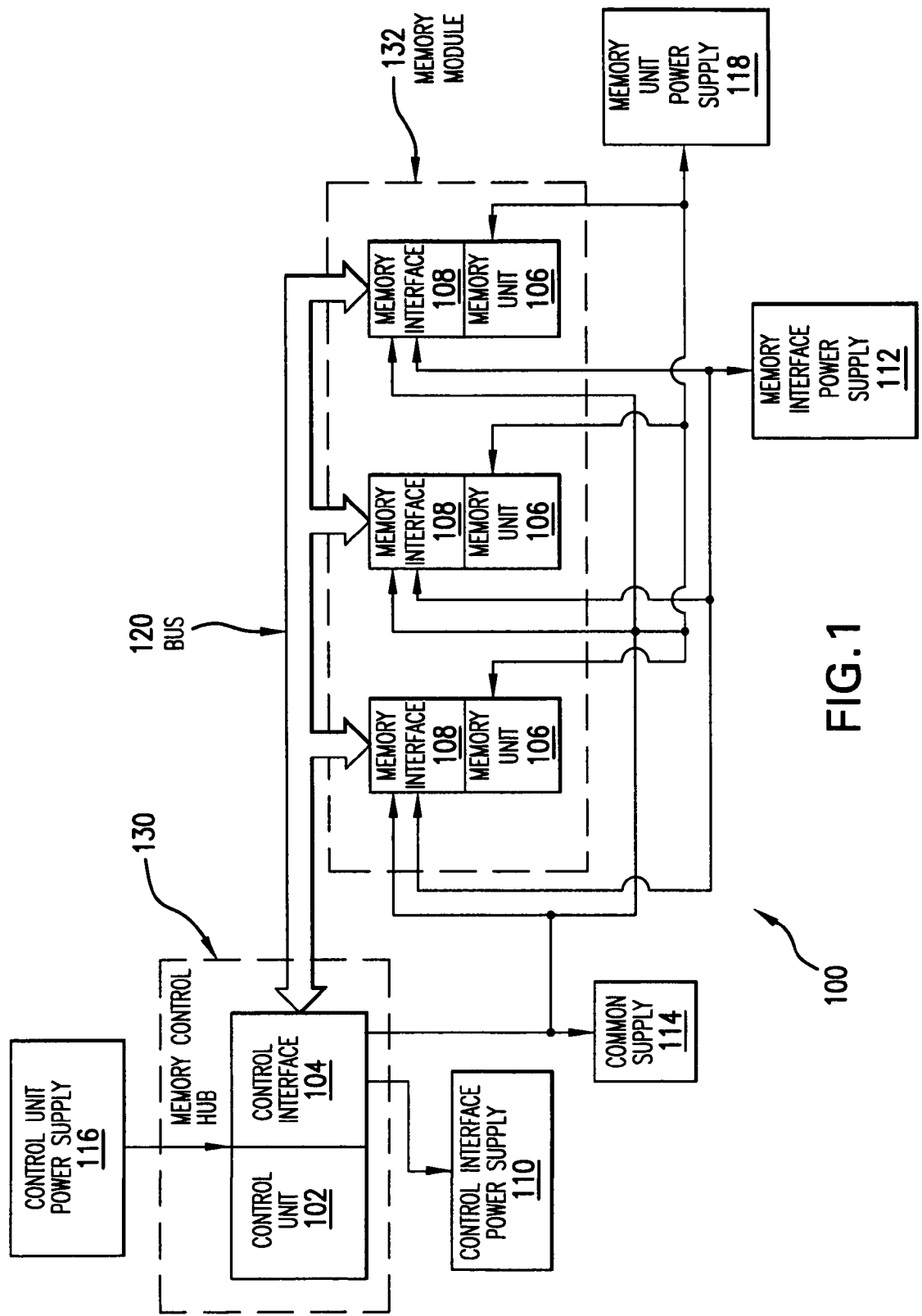
FIG. 1 is a schematic view of one embodiment of a memory interface system according to the present invention.

FIG. 1 depicts memory interface system 100 in accordance with the systems and methods described herein. Memory interface system 100 includes control unit 102 located in MCH 130, and memory units 106 located in memory module 132. MCH 130 also includes control interface 104, which is supplied by control interface power supply 110. Each memory unit 106 couples to a memory interface 108, which is supplied by memory interface power supply 112. Additionally, control unit 102 is supplied by control unit power supply 116 and memory units 106 are supplied by memory unit power supply 118.

Control unit 102 communicates with each memory unit 106 via bus 120, which is preferably a multi-drop bus. In the multi-drop architecture, control unit 102 would operate as the master and memory units 106 would operate as slaves. Control unit 102 controls each memory unit 106 by transferring command, memory, and addressing data to each selected memory interface 108 over bus 120. Memory unit 106 responds, if needed, by transferring memory and addressing data from memory interface 108 back to control interface 104 and control unit 102. Both control interface 104 and memory interfaces 108 are connected to common supply 114.

In one embodiment, bus 120 is a 64-bit (b) bus. Each memory interface 108 includes an 8 b bus connected to bus 120 for communication with control unit 102. This embodiment allows up to eight memory units 106 to be included on memory module 132. Accordingly, control interface 104 connects directly to bus 120, and control interface 104 includes a 64 b bus for communication with the eight memory units 106. Control interface 104 and each memory interface 108 are single-ended interfaces, or require only one signal to transfer a logic level. A differential interface, or an interface requiring two signals to transfer a single logic level, would require a 128 b bus for control interface 104, and a 16 b bus for each memory interface 108. Size constraints within PC's and workstations, and on memory module 132, generally do not allow for a 128 b bus between control interface 104 and memory interfaces 108.

Memory interface system 100 allows control interface 104 and memory interfaces 108 to operate using isolated interface power supplies 110 and 112, respectively. This advantage allows each interface 104 and 108 to operate at a voltage supply level specifically optimized for the performance requirements of that interface without introducing additional delays or cost overhead.

An interface transfers data by outputting a digital output signal onto a bus, the output signal being either a logic high level or a logic low level. These logic levels are predetermined voltage levels, where a logic high is output at a voltage output high level ($V_{OH}$) and a logic low is output at another, lower, voltage output low level ($V_{OL}$). The difference between $V_{OH}$ and $V_{OL}$ is referred to as the voltage output swing.

In typical memory systems, $V_{OH}$ is chosen at or near the level of the interface power supply, while $V_{OL}$ is at a level approximately 10–30% lower. The interface power supply then provides a reference for the voltage output levels and supplies power to both the control interface and the memory interface.

However, when the control interface and memory interfaces operate using the same interface power supply, performance can be compromised. Memory units 106 generally need to operate at a different voltage, usually higher than control unit 102 because of the characteristics of the memory process technologies that are used. Memory process technologies usually have thicker device (P-type & N-type) gate oxide. This keeps the manufacturing costs lower for memory products. With the thicker device gate oxide, the speed of operation in memory unit 106 is limited. In order to make up for this speed deficiency, particularly when memory units 106 are interfacing with control unit 102, memory units 106 generally need to operate at a higher voltage. Therefore if the level of memory interface power supply 112 is chosen to optimize control unit 102 performance, then memory unit 106 must be designed to interface at a lower voltage. This in turn slows down memory interface 108 in memory unit 106.

Control unit 102 is usually implemented with a microprocessor type of process technology. The microprocessor type of process technology uses thinner device gate oxide to boost up the operating speed. However, devices with thinner gate oxide cannot withstand higher voltage supplies, like the one required by memory unit 106. Therefore a higher memory interface power supply 112 level chosen to optimize memory unit 106 performance will sacrifice the reliability of memory system interface 100.

Some typical memory systems have attempted to minimize this inefficiency by creating special devices (P-type & N-type) with thicker oxides in the microprocessor process technology. However, this adds cost to the process technology. Furthermore it hinders the advancement of the process in terms of its optimum operation speed that the process can provide.

Other typical memory systems have attempted to minimize this inefficiency by the use of a buffer circuit between the control and memory interfaces. A buffer circuit enables the control interface and memory interfaces to operate with independent interface power supplies. Accordingly, in order to maximize performance, the control interface uses voltage output levels that are set with reference to the control interface supply and the memory interfaces use voltage output levels that are set with reference to the memory interface supply.

Each interface is connected to the buffer circuit, which takes the outputs and scales them to a higher or lower voltage level, whichever is necessary to transfer data to the receiving interface. The buffer circuit then outputs the signal to the correct interface at the scaled level. However, the buffer circuit is connected to both interface power supplies to properly scale the signals. This makes packaging the buffer circuit difficult because access to multiple power supplies is required. Typically, the buffer circuit is packaged in a ball-grid array (BGA) and to add another power supply requires the addition of another power plane. As the number of power planes in a BGA increases, so does the cost. The BGA also becomes more susceptible to defects within the printed circuit board. Therefore, this method of eliminating the need for the shared interface power supply adds an additional circuit as well as cost overhead to the entire memory system interface.

Memory interface system 100 can operate without a buffer circuit and still eliminate the inefficiencies created by separate interface power supplies. Memory interface system 100 uses voltage output levels referenced to shared common supply 114, which is preferably ground. $V_{OL}$ is preferably set at or near this common supply 114, while $V_{OH}$ is set at a higher level. $V_{OH}$ is preferably set less than interface power supplies 110 and 112, and provides a voltage output swing large enough to overcome noise levels, while at the same time small enough to enable proper operation at the desired frequencies. The specific voltage output levels chosen are dependent on each application and environment. Since interface power supplies 110 and 112 are set to levels that optimize interface performance, and are preferably levels that are higher than the voltage output levels, both the control and memory interfaces 104 and 108 can satisfy the voltage output swing without compromising performance.

In one embodiment for example, control unit power supply 116 and control interface power supply 110 both operate at 2 volts (v), while memory unit power supply 118 and memory interface power supply 112 both operate at 3.3 v. Both control interface 104 and memory interface 108 are coupled with common supply 114, in this case ground, or 0 v. $V_{OL}$ is set to the common supply 114 voltage level. $V_{OH}$ is set at 0.8 v, so that a logic high data signal transferred over bus 120 would be output at 0.8 v, while a logic low would be output at 0 v. This voltage output swing of 0.8 v is well within the interface power supply range of both control unit 102 and memory unit 106. Therefore this configuration allows each interface 104 and 108 to operate at an optimized interface power supply level.

Control interface 104 and memory interface 108 preferably include input/output (IO) pins used for data transfer over bus 120. Each IO pin includes a driver for outputting signals and a receiver for receiving output signals over bus 120. The driver provides enough current to drive the output signal over bus 120 to a receiver at the receiving interface. The drivers and receivers coupled to bus 120 and bus 120 itself all create loads and noise which hinder the ability to transfer data over bus 120. Noise and loading degrades the signal integrity of the output signal and makes it difficult for the receiver to successfully interpret the logic levels. Thus, the driver must provide enough current to overcome the loading and noise degradation and maintain the signal integrity at a level sufficient for the receiver to interpret the data.

Figure 2:
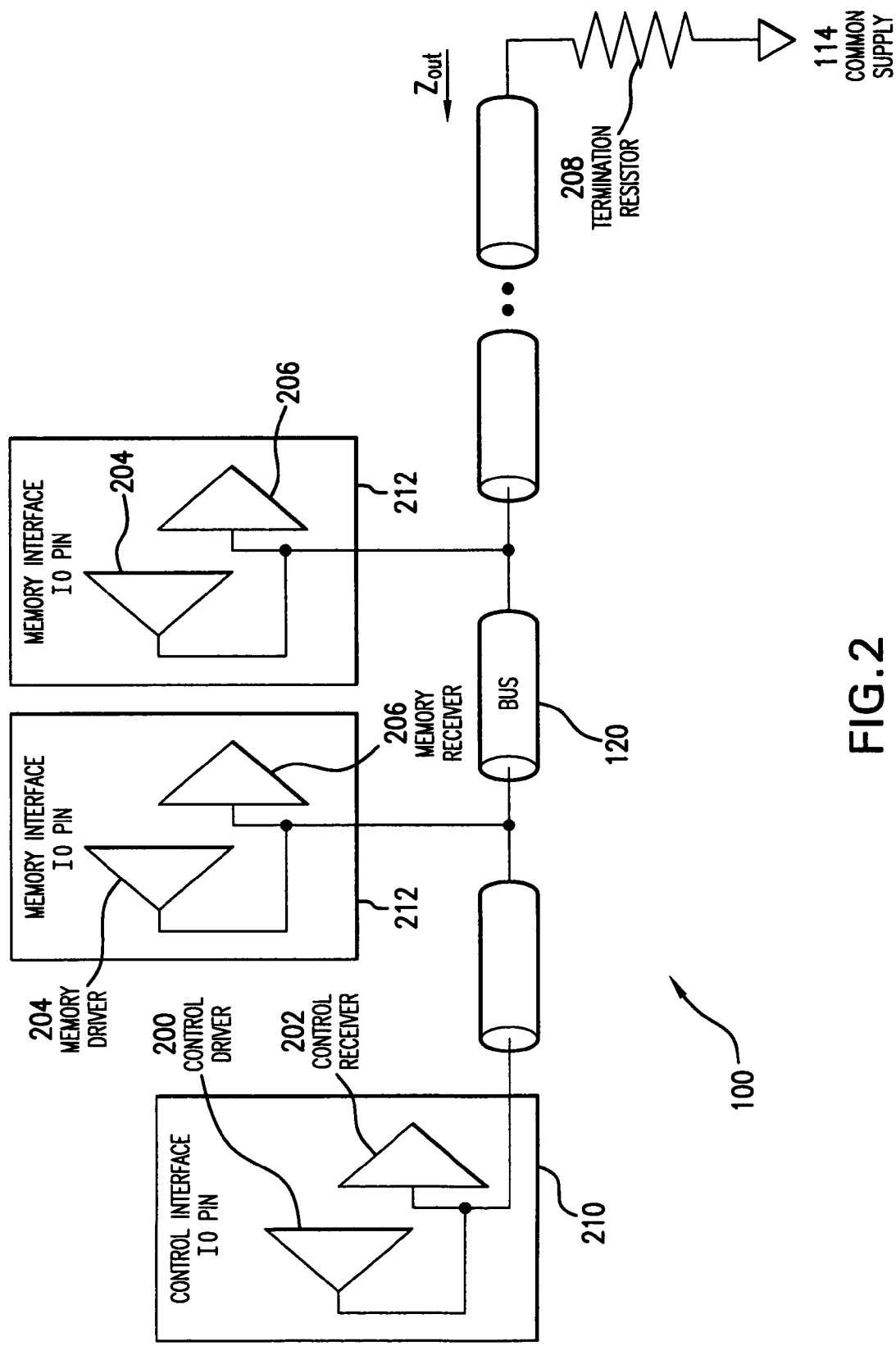
FIG. 2 is a schematic view of the memory interface system of FIG. 1 depicting driver and receiver arrangement.

FIG. 2 depicts memory interface system 100 in accordance with the systems and methods described herein. Shown here is control interface 10 pin 210 coupled to bus 120. Control interface 10 pin 210 includes control driver 200 and control receiver 202. Bus 120 is further coupled to memory interface 10 pins 212. Each memory interface 10 pin 212 includes a memory driver 204 and memory receiver 206. Bus 120 is terminated with termination resistor 208, which is coupled to common supply 114.

Figure 3:
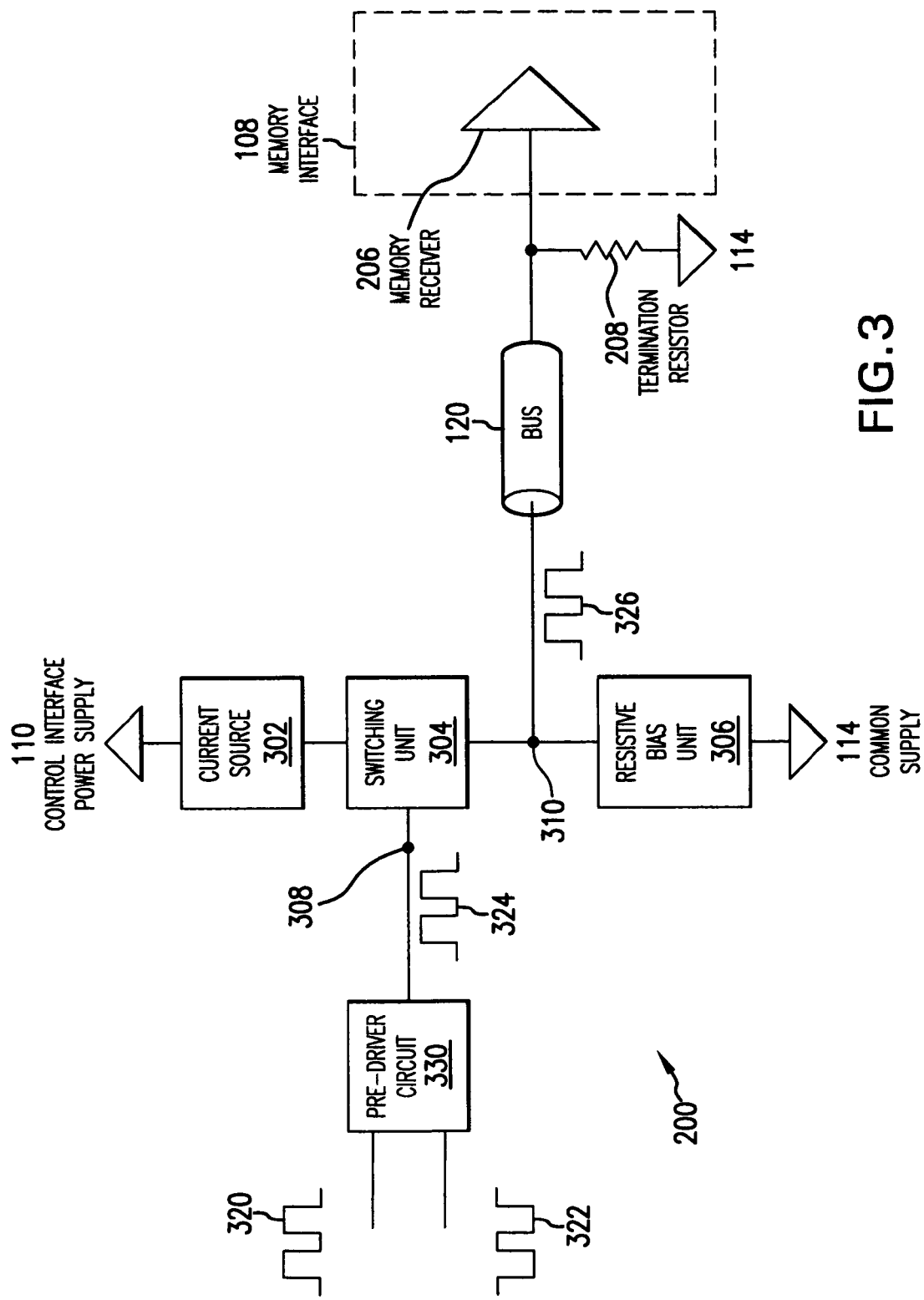
FIG. 3 is a schematic view of one embodiment of the control driver of FIG. 2.

FIG. 3 depicts control driver 200 in accordance with the systems and methods described herein. Control driver 200 preferably includes current source 302, switching unit 304 and resistive bias unit 306. Current source 302 is coupled to control interface power supply 110 and resistive bias unit 306 is coupled to common supply 114. Control output signal 326 is output at output 310, which is coupled to bus 120.

By using current source 302, as opposed to a voltage source, control driver 200 creates a high internal resistance at output 310. This high internal resistance is less susceptible to noise and allows control driver 200 to operate at higher frequencies than a driver implementing a voltage source does. Depending on the application, this internal resistance, sometimes referred to as the on resistance, can be on the order of 20 times larger than a driver using a voltage source.

Pre-driver circuit 330 senses the difference between differential control input signals 320 and 322 and converts them to single-ended control input signal 324 at input 308. Differential control input signals 320 and 322 are internal logic signals generated by control unit 102. Pre-driver circuit 330 also controls the data edge rate of control input signal 324 and preferably provides faster voltage swings which translate into more abrupt logic transitions. Pre-driver circuit 330 is preferably included within control driver 200, but can be left out of the driver design if the application does not require additional data edge rate control.

Switching unit 304 is configured to open and close according to control input signal 324. When switching unit 304 is open, current source 302 cannot provide control output current to output 310. Output 310 is driven to common supply 114 and a corresponding logic low signal is output to bus 120. When switching unit 304 is closed, current source 302 drives control output current through resistive bias unit 306. Resistive bias unit 306 is a resistive load that creates a voltage drop when control output current is passed through it. Control output signal 326 is transferred over bus 120 to memory receiver 206 at memory interface 108, which interprets the logic high and logic low levels of the data signal.

In a preferred embodiment, common supply 114 is set to ground. This configuration provides the advantage of driving control output current only when output 310 is a logic high. When switching unit 304 is open, output 310 is driven to common supply 114, but since no control output current is passing through switching unit 304, control driver 200 dissipates no power. Control driver 200 dissipates a significantly larger amount of power when switching unit 304 is closed and control output current is passing through it. The typical configuration where current is driven at both voltage output levels will result in twice the power dissipation.

In this embodiment, common supply 114 is set to ground, so $V_{OL}$ is equal to 0 v. Therefore, $V_{OH}$ is equal to the output voltage swing ($V_{out}$) for memory interface system 100. $V_{out}$ is equal to the output current ($I_{out}$) times the effective resistance in the channel ($R_{out}$), which is termination resistor 208 in parallel with resistive bias unit 306 or:

$$V_{out} = I_{out} \cdot R_{out}$$

Termination resistor 208 and resistive bias unit 306 are set at a resistance so that the parallel combination of each ($R_{out}$) will be at or near the output impedance ($Z_{out}$) of bus 120, which is measured at the termination of bus 120 as shown in FIG. 2. This is in order to minimize signal reflections created by the termination of bus 120. Preferably, $R_{out}$ will be in the range of 40–50 ohms ($\Omega$). In this embodiment, $Z_{out}$ and $R_{out}$ are both 50 $\Omega$.

The power budget available to control interface 104 determines the $I_{out}$ provided by current source 302. The power budget is the amount of power available over time, and is determined by the application and typically depends on the available power supplies, heat dissipating equipment and maximum reliable operating temperatures. In this embodiment, current source 302 has 64 separate IO pins 210, each connected to 64 b bus 120. The power budget should be greater than or equal to control interface power supply 110 times $I_{out}$ times the number of IO pins, or:

$$\text{Power Budget} \geq I_{out} \cdot \text{Power Supply 110} \cdot \text{number IO pins}$$

In this embodiment, current source 302 is configured to supply 20 milliamps (mA) and control interface power supply 110 is 1 v. Therefore, this embodiment would satisfy a power budget of at least 1.28 W.

Figure 4:
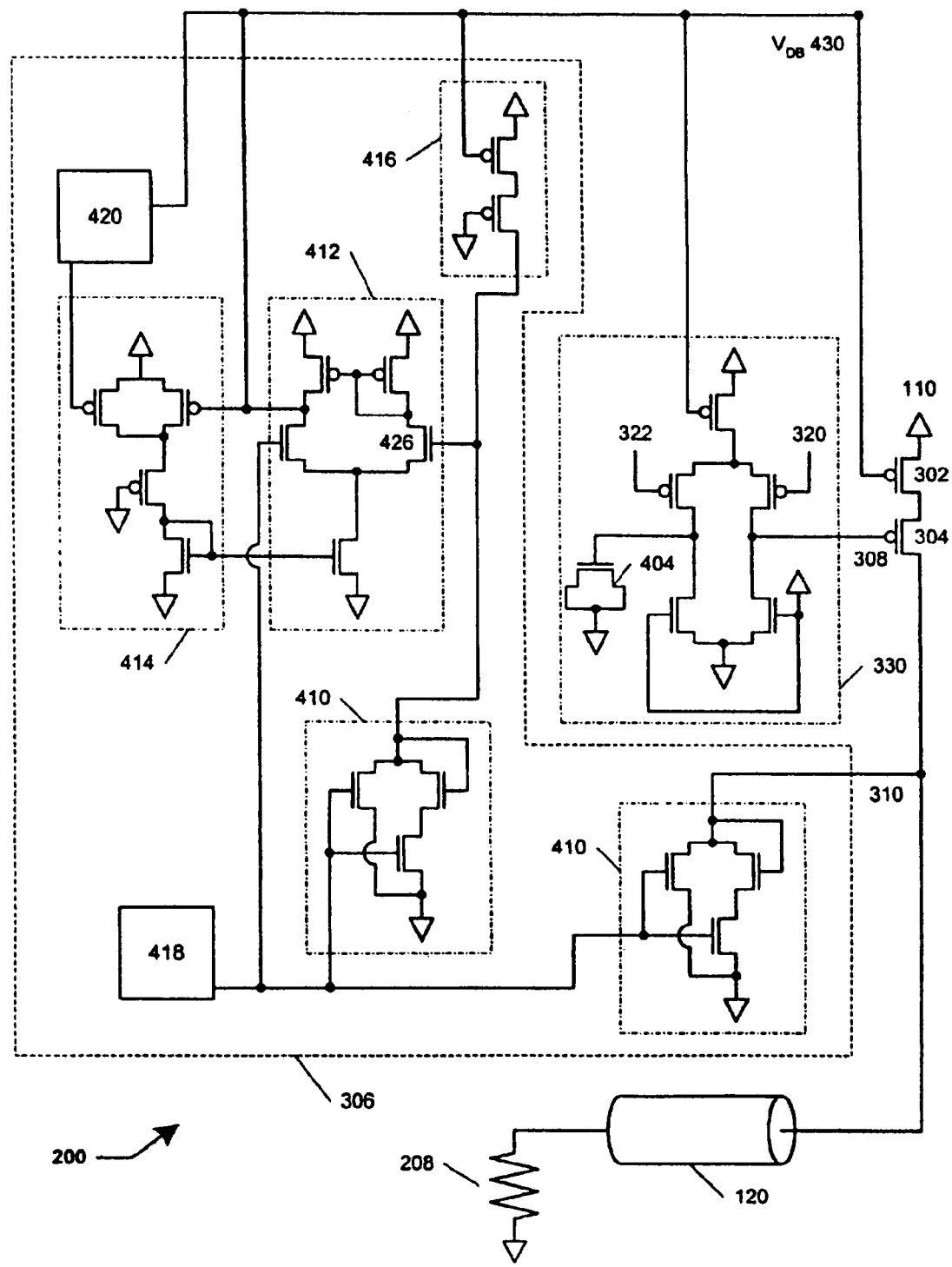
FIG. 4 is a schematic view of another embodiment of the control driver of FIG. 2.

FIG. 4 depicts one embodiment of control driver 200 in accordance with the systems and methods described herein. In this embodiment, current source 302 and switching unit 304 are P-type transistors and pre-driver circuit 330 is a sense amplifier. To balance the load created by input 308, pre-driver circuit 330 includes capacitive load 404. Resistive bias unit 306 is also preferably coupled to switching unit 304, current source 302 and bus 120 at output 310. Resistive bias unit 306 provides resistive loads 410 to switching unit 304. Resistive bias unit 306 is sized to match termination resistor 208 in order to minimize signal reflections, and in this embodiment resistive bias unit 306 has a resistance of 50 $\Omega$. In addition to providing resistive loads 410, resistive bias unit 306 also provides the capability of tracking the control output current supplied to control driver 200 through current source 302.

Process variations in the fabrication process can skew the size of the circuitry within memory interface system 100. These process variations in turn result in performance variations, particularly in the output current drawn by control driver 200 and memory driver 204. For instance, if the resistance provided by a resistive load 410 varies, then the output current drawn by control driver 200 will vary as well. The output current may be either too high or too low, and this causes constraints on memory interface system 100. Control interface 104 and memory interfaces 108 must then be designed to accept the variations in output current levels resulting from the process variations. This has a negative impact on the operating performance of memory interface system 100. Also, since designs transfer to new semiconductor processes frequently, control interface 104 and memory interface 108 must be redesigned and rescaled to make fabrication in a new process successful.

By tracking the control output current of current source 302, resistive bias unit 306 adjusts the performance of control driver 200 to maintain constant output current levels despite process variations. Resistive bias unit 306 includes resistive loads 410, sense amplifier 412, first bias circuit 414, second bias circuit 416, third bias circuit 418 and initialization circuit 420. First bias circuit 414, second bias circuit 416 and initialization circuit 420 provide a constant driver bias voltage ($V_{DB}$) 430 to resistive bias unit 306.

If control driver 200 outputs too little output current from current source 302 due to any fluctuation in $V_{DB}$ 430. say an increase in $V_{DB}$ 430. the incremental increase in $V_{DB}$ 430 will cause a decrease at the gate input of transistor 426 from its nominal voltage value Sense amplifier 412 will then pull $V_{DB}$ 430 back to it's nominal value. Therefore this decrease in $V_{DB}$ 430 returns the control output current to the proper level through current source 302.

The converse is true as well, any increase in control output current caused by a decrease in $V_{DB}$ 430, in turn creates an increase at the gate input of transistor 426. In this manner, resistive bias unit 306 tracks the control output current of control driver 200 and allows control driver 200 to drive the correct voltage output levels independent of any process skews.

The current tracking capability of resistive bias unit 306 provides a further advantage in sizing the p-type transistors comprising current source 302 and switching unit 304. In typical semiconductor processing, p-type transistors are larger than their n-type counterparts in order to counteract doping inefficiencies. Because it is cost efficient to keep circuit sizes small, p-type transistors are disfavorable. However, the tracking capability provided by resistive bias unit 306 allows the p-type transistors comprising current source 302 and switching unit 304 to be smaller because the transistors do not have to take into account the process skews that would negatively effect the driver operating performance.

Initialization circuit 420 also provides the proper initialization to control driver 200 when control unit 102 is first powered up. Third bias circuit 418 provides a constant bias to resistive loads 410, which is composed of several n-type transistors in this embodiment. The constant bias provided to resistive loads 410 operates to keep resistive loads 410 in a constant operating state, which, in turn creates a constant resistance. The size of the n-type transistors and the bias provided are pre-determined to create a resistance equal or near that of termination resistor 208, which in this embodiment is 50 Ω.

Figure 5:
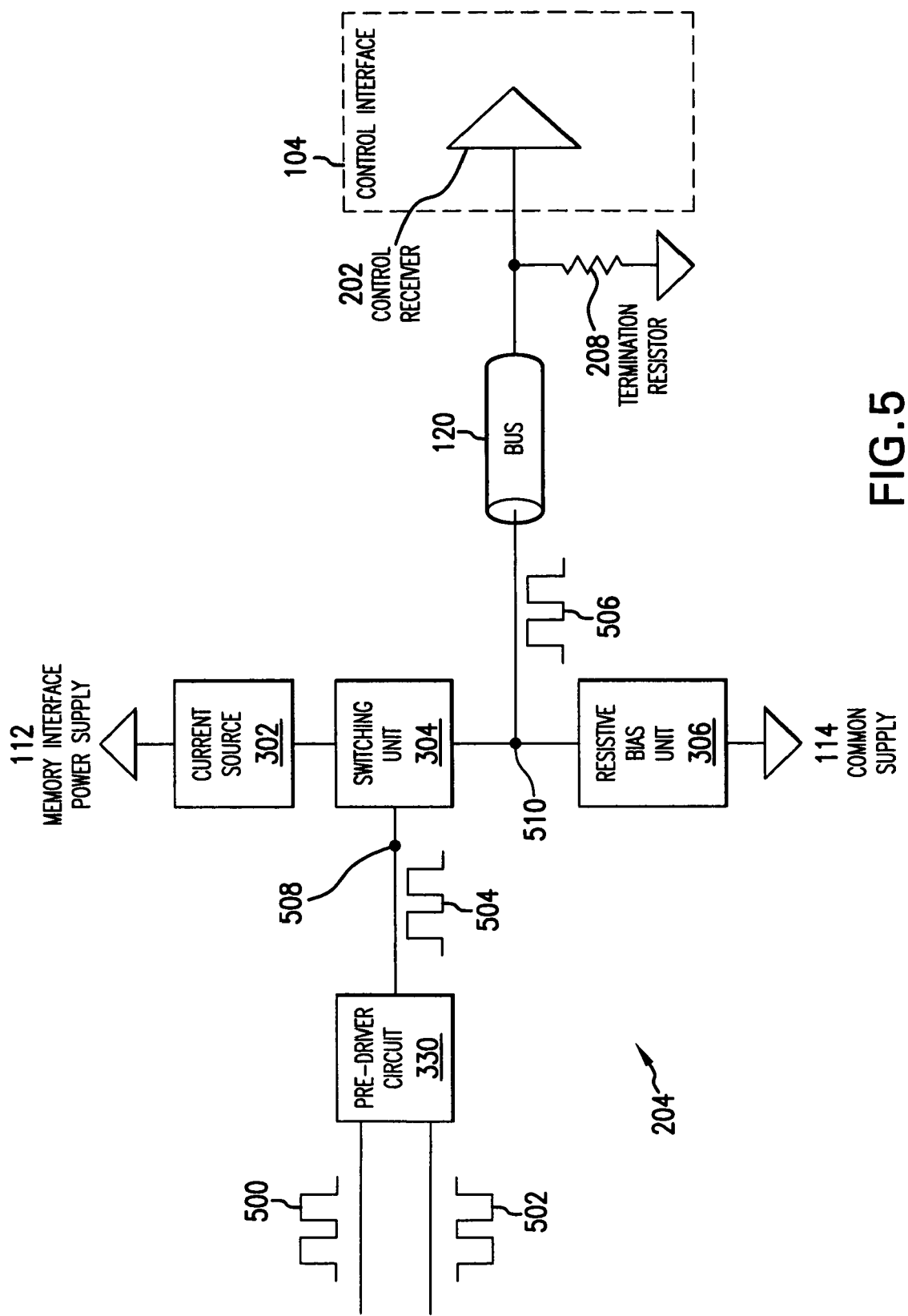
FIG. 5 is a schematic view of one embodiment of the memory driver of FIG. 2.

FIG. 5 depicts memory driver 204 in accordance with the systems and methods described herein. Memory driver 204 operates in a manner similar to that of control driver 200 and preferably includes current source 302, switching unit 304 and resistive bias unit 306. Current source 302 is coupled to memory interface power supply 112 and resistive bias unit 306 is coupled to common supply 114. Memory output signal 506 is output at output 510, which is coupled to bus 120.

Pre-driver circuit 330 senses the difference between differential memory input signals 500 and 502 and converts them to single-ended memory input signal 504 at input 508. Differential memory input signals 500 and 502 are internal logic signals generated by memory unit 106. Pre-driver circuit 330 also controls the data edge rate of memory input signal 504 and preferably provides faster voltage swings, which translate into more abrupt logic transitions. Pre-driver circuit 330 is preferably included within memory driver 204, but can be disregarded if the application does not require additional data edge rate control.

When switching unit 304 is open, current source 302 cannot provide memory output current to output 510. Output 510 is driven to common supply 114 and a corresponding low signal is output to bus 120. When switching unit 304 is closed, current source 302 drives memory output current through resistive bias unit 306. Resistive bias unit 306 is a resistive load that creates a voltage drop when control output current is passed through it. Memory output signal 506 is transferred over bus 120 to control receiver 202 at control interface 104, which interprets the logic high and logic low levels of the data signal.

Figure 6:
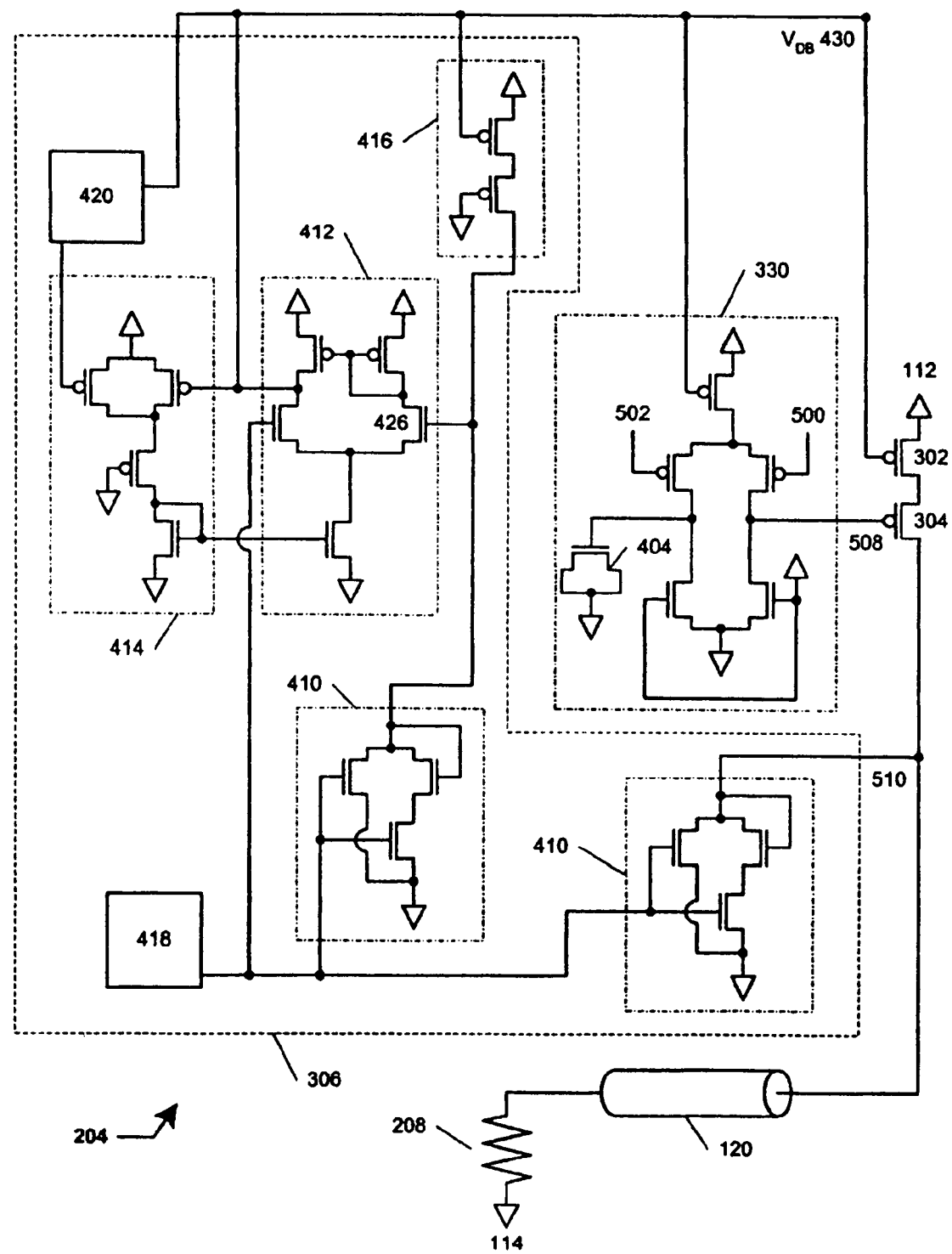
FIG. 6 is a schematic view of another embodiment of the memory driver of FIG. 2.

FIG. 6 depicts one embodiment of memory driver 204 in accordance with the systems and methods described herein. In this embodiment, current source 302 and switching unit 304 are P-type transistors and pre-driver circuit 330 is a sense amplifier. Pre-driver circuit 330 senses the difference between differential input signals 500 and 502 and converts them to single-ended memory input signal 504 at input 508. Differential input signals 500 and 502 are internal logic signals generated by memory unit 106. To balance the load created by input 508, pre-driver circuit 330 includes capacitive load 404. Pre-driver circuit 330 is also connected to resistive bias unit 306, which controls the amount of current supplied to pre-driver circuit 330.

Resistive bias unit 306 is also preferably coupled to switching unit 304, current source 302 and bus 120 at output 510. Resistive bias unit 306 provides resistive loads 410 to switching unit 304. Resistive bias unit 306 is sized to match termination resistor 208 in order to minimize signal reflections, and in this embodiment resistive bias unit 306 has a resistance of 50 Ω. In addition to providing resistive loads 410, resistive bias unit 306 also provides the capability of tracking the memory output current supplied to memory driver 204 through current source 302.

By tracking the memory output current of current source 302, resistive bias unit 306 adjusts the performance of memory driver 204 to maintain constant output current levels despite process variations. Resistive bias unit 306 includes resistive loads 410, sense amplifier 412, first bias circuit 414, second bias circuit 416, third bias circuit 418 and initialization circuit 420. First bias circuit 414, second bias circuit 416 and initialization circuit 420 provide a constant driver bias voltage ($V_{DB}$) 430 to resistive bias unit 306.

If memory driver 204 outputs too little output current from current source 302 due to any fluctuation in $V_{DB}$ 430, say an increase in $V_{DB}$ 430, the incremental increase in $V_{DB}$ 430 will cause a decrease at the gate input of transistor 426 from its nominal voltage value. Sense amplifier 412 will then pull $V_{DB}$ 430 back to it's nominal value. Therefore, this decrease in $V_{DB}$ 430 returns the memory output current to the proper level through current source 302.

The converse is true as well, any increase in memory output current caused by a decrease in $V_{DB}$ 430, in turn creates an increase at the gate input of transistor 426. In this manner, resistive bias unit 306 tracks the memory output current of memory driver 204 and allows memory driver 204 to drive the correct voltage output levels independent of any process skews.

Figure 7:
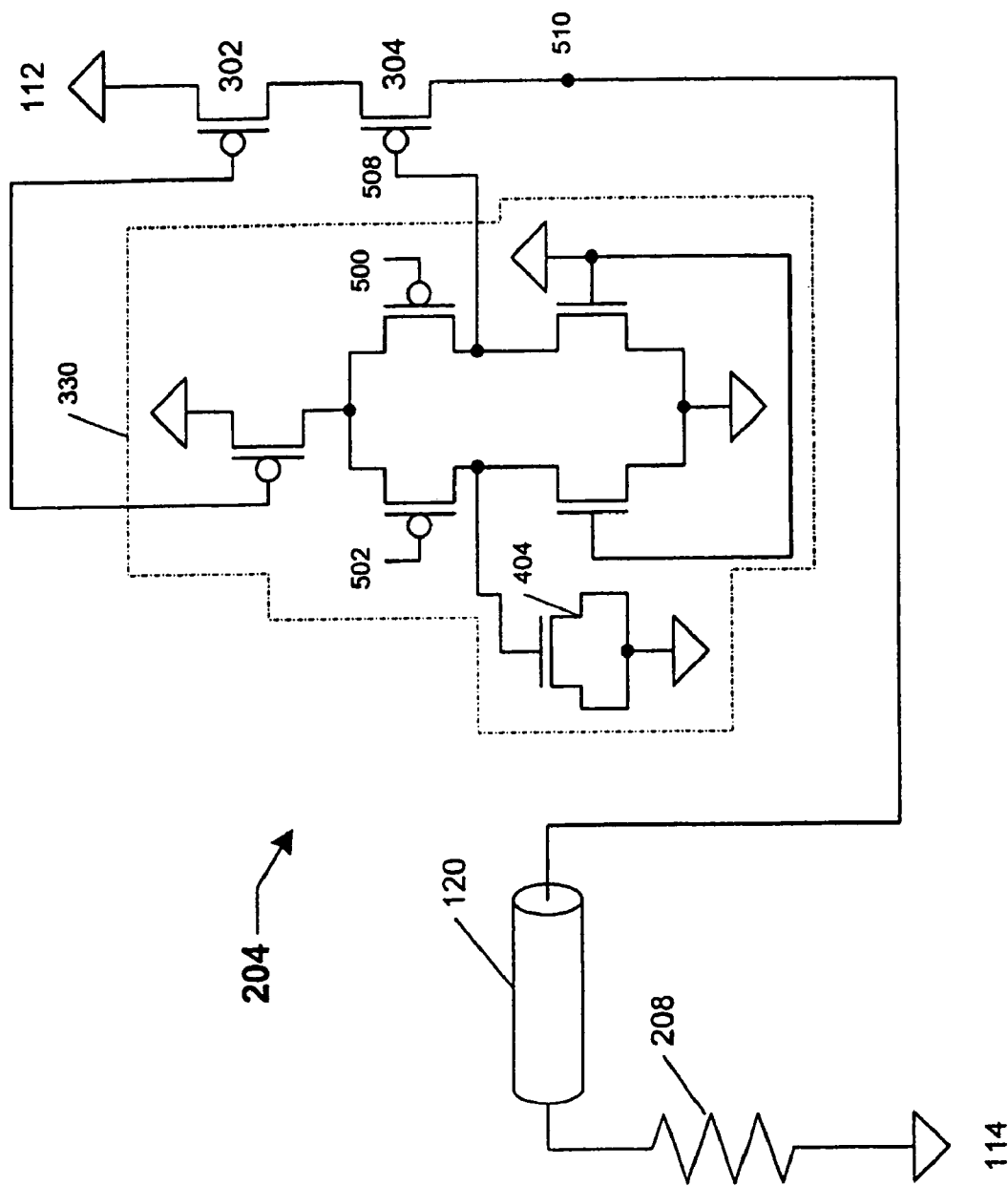
FIG. 7 is a schematic view of another embodiment of the memory driver of FIG. 2.

FIG. 7 depicts another embodiment of memory driver 204 in accordance with the systems and methods described herein. This embodiment does not require resistive bias unit 306 to provide a resistive load or memory output current tracking capability. Instead, switching unit 304 couples directly to bus 120 and not common supply 114. As a result, memory driver 204 relies on the resistive load created by termination resistor 208 and control interface 104. By eliminating resistive bias unit 306, memory interface 108 dissipates less power because there is no voltage drop over resistive bias unit 306. Also, the size of memory interface 108 is reduced because the additional circuitry needed to comprise resistive bias unit 306 is eliminated.

In this embodiment, current source 302 and switching unit 304 are P-type transistors and pre-driver circuit 330 is a sense amplifier. To balance the load created by input 508, pre-driver circuit 330 includes capacitive load 404.

Figure 8:
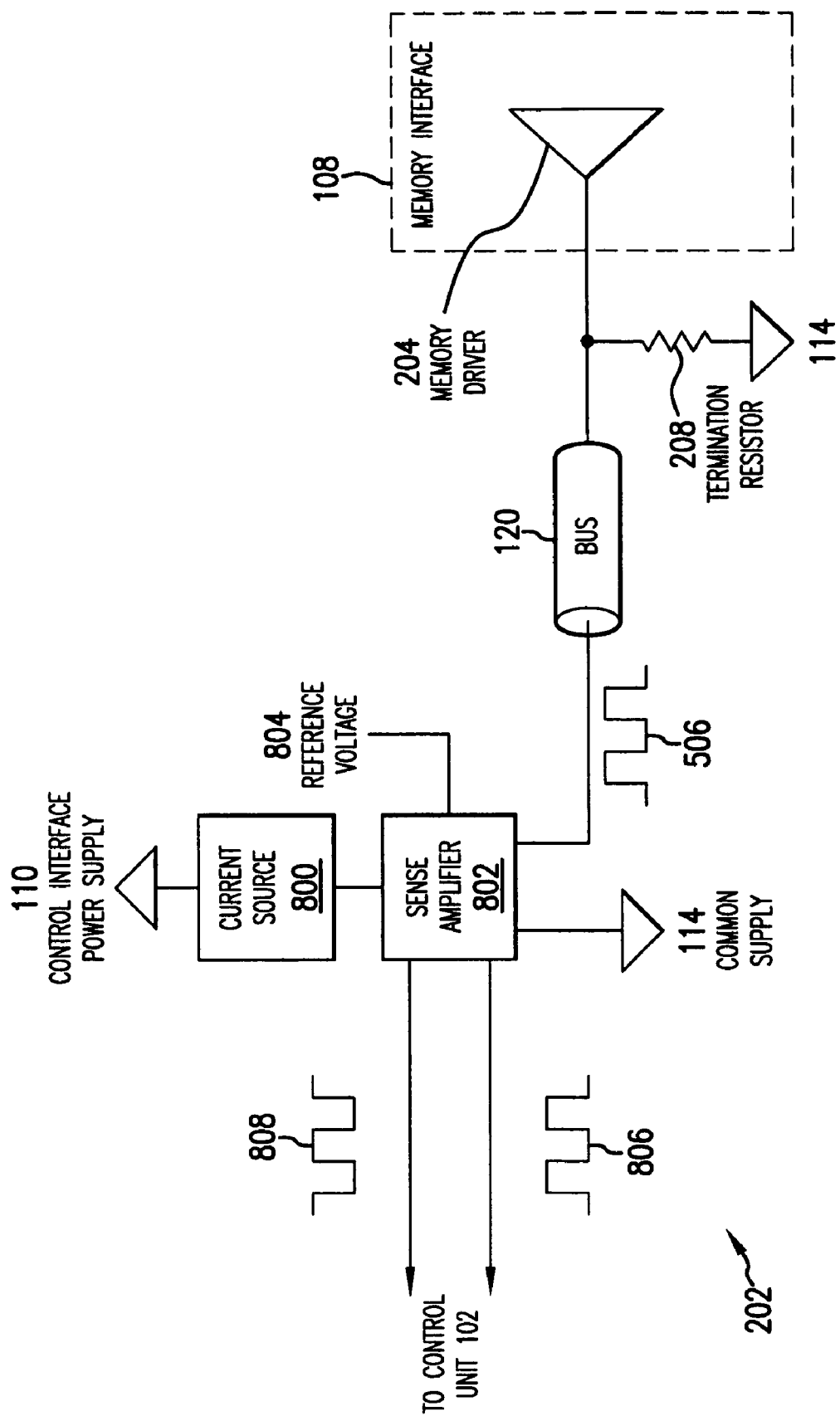
FIG. 8 is a schematic view of one embodiment of the control receiver of FIG. 2.

FIG. 8 depicts control receiver 202 in accordance with the systems and methods described herein. Control receiver 202 includes current source 800 coupled to control interface power supply 110 and to sense amplifier 802. Current source 800 provides the current to sense amplifier 802, which is coupled to common supply 114 and to bus 120. Sense amplifier 802 receives memory output signal 506 from memory interface 108. Sense amplifier 802 then uses reference voltage 804 to create differential output signals 806 and 808, which are output to control unit 102. Control receiver 202 scales the received signal to an internal level that is used by control unit 102. Once the received signal is at the proper level, control unit 102 can perform data manipulation.

Figure 9:
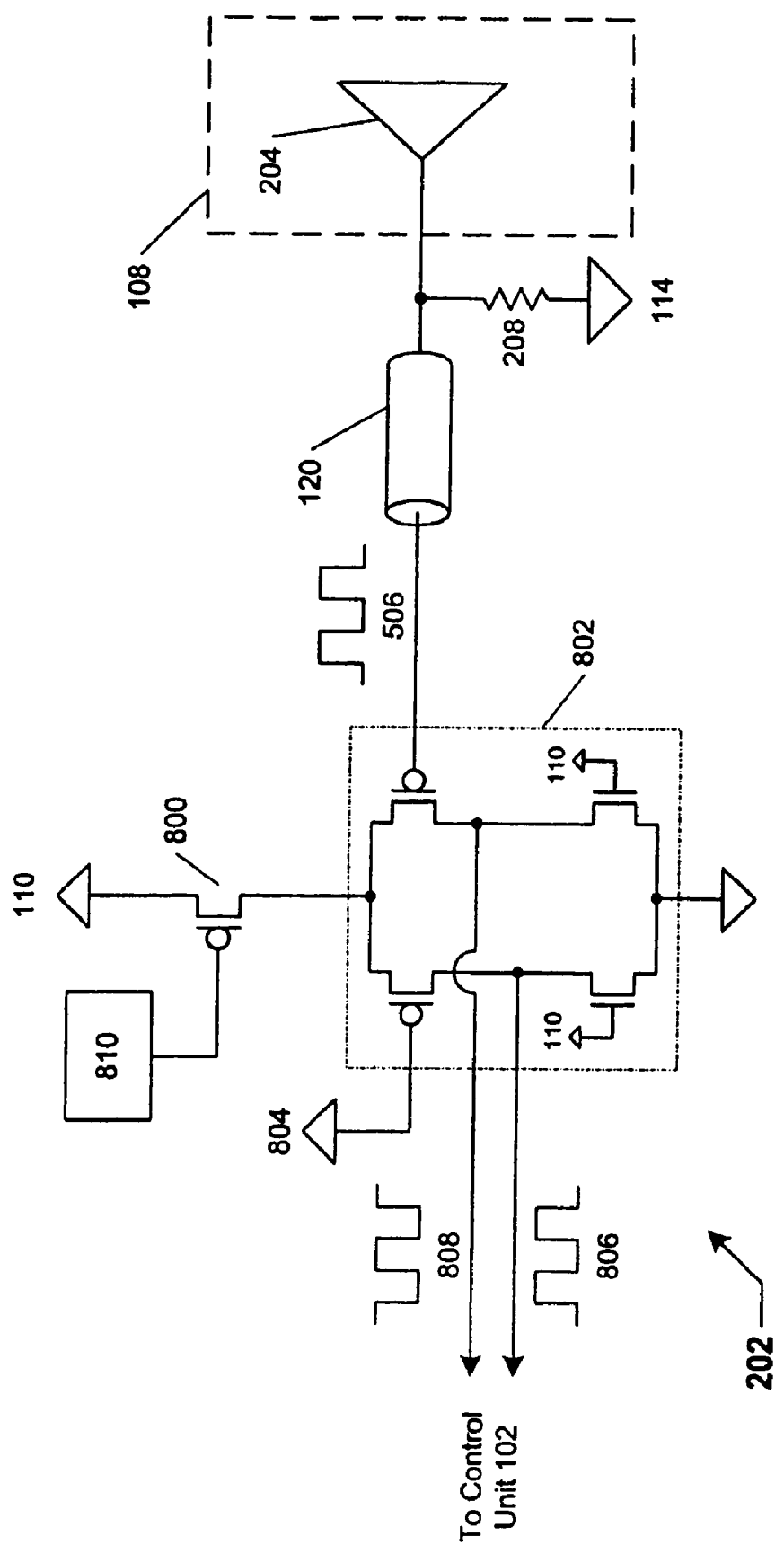
FIG. 9 is a schematic view of another embodiment of the control receiver of FIG. 2.

FIG. 9 depicts an embodiment of control receiver 202 in accordance with the systems and methods described herein. In this embodiment, current source 800 is a P-type transistor, which is biased by bias circuit 810. Sense amplifier 802 includes two N-type and P-type transistor pairs, where the junctions of the P-type and N-type transistors provide the differential output signals 806 and 808. Reference voltage 804 is compared to the voltage level of the incoming memory output signal 506 and the difference in voltage is used to generate differential output signals 806 and 808.

Figure 10:
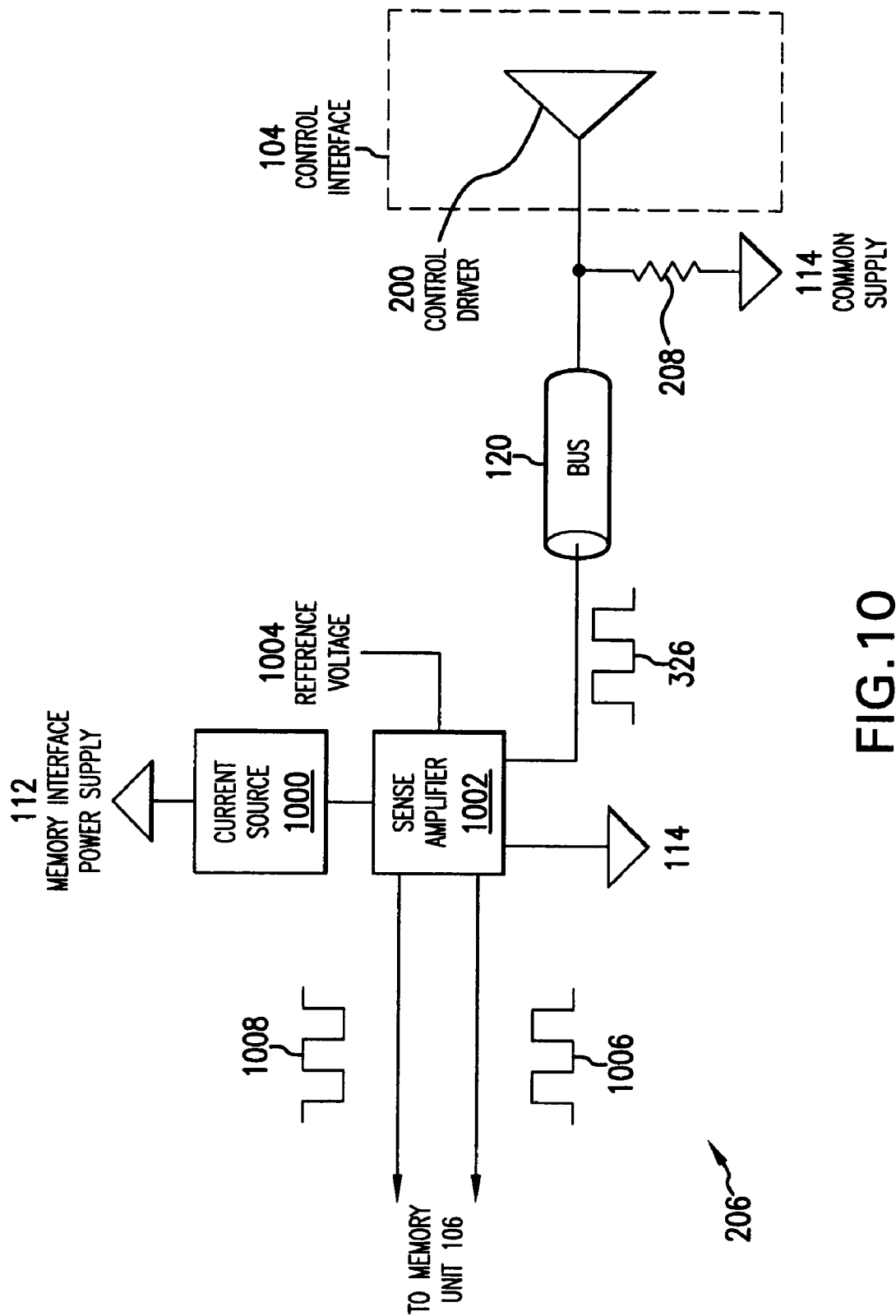
FIG. 10 is a schematic view of one embodiment of the memory receiver of FIG. 2.

FIG. 10 depicts memory receiver 206 in accordance with the systems and methods described herein. Memory receiver 206 is similar to control receiver 202 and includes current source 1000 coupled to memory interface power supply 112 and to sense amplifier 1002. Current source 1000 provides the current to sense amplifier 1002, which is coupled to common supply 114 and to bus 120. Sense amplifier 1002 receives control output signal 326 from control interface 104. Sense amplifier 1002 then uses reference voltage 1004 to create differential output signals 1006 and 1008 which are output to memory unit 106. Memory receiver 206 scales the received signal to an internal level that is used by memory unit 106. Once the received signal is at the proper level, memory unit 106 can perform data manipulation.

Figure 11:
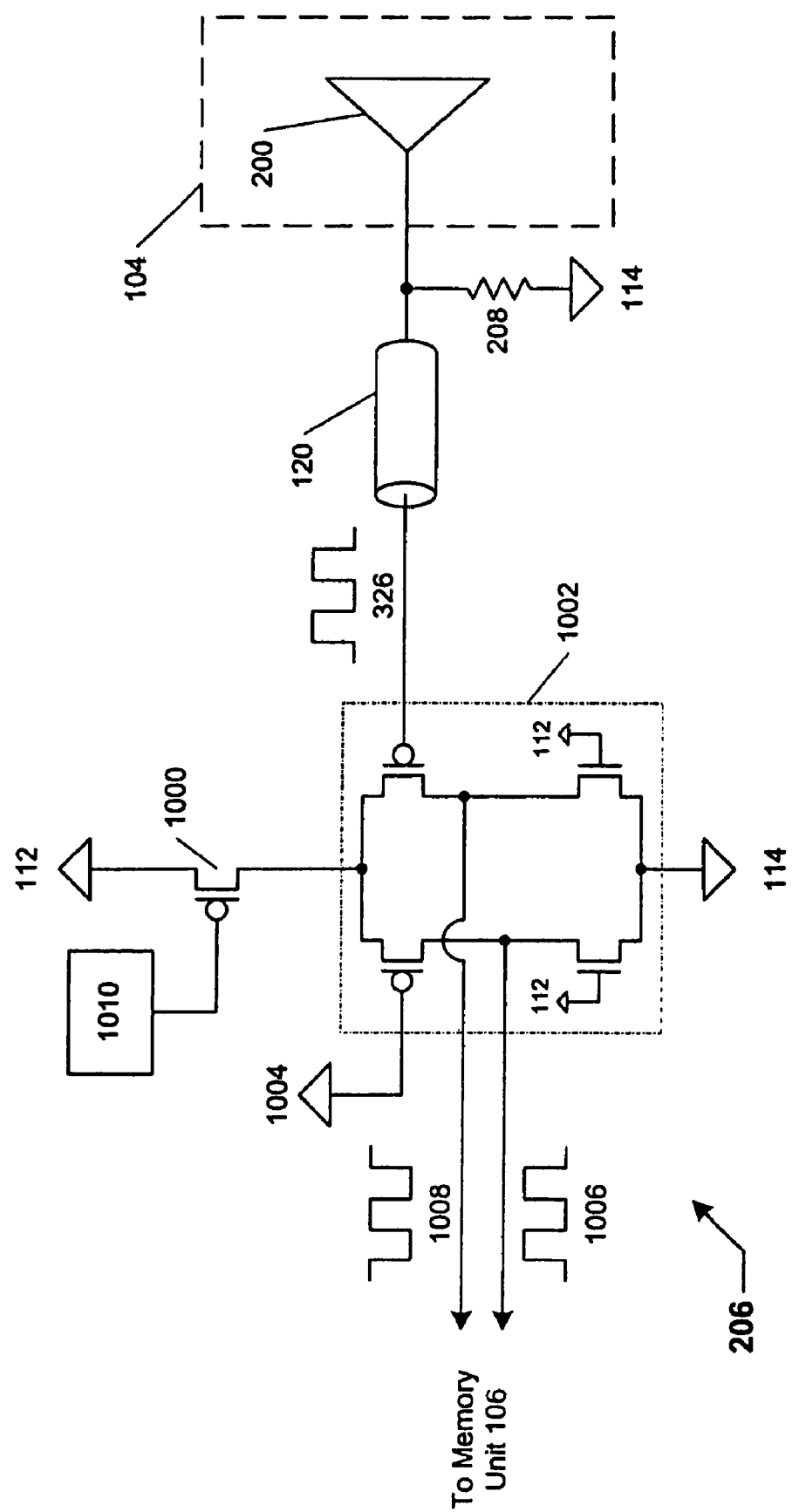
FIG. 11 is a schematic view of another embodiment of the memory receiver of FIG. 2.

FIG. 11 depicts an embodiment of memory receiver 206 in accordance with the systems and methods described herein. In this embodiment, current source 1000 is a P-type transistor, which is biased by bias circuit 1010. Sense amplifier 1002 includes two N-type and P-type transistor pairs, where the junctions of the P-type and N-type transistors provide the differential output signals 1006 and 1008. Reference voltage 1004 is compared to the voltage level of the incoming control output signal 326 and the difference in voltage is used to generate differential output signals 1006 and 1008.

While various embodiments of the invention have been described, it will be apparent to those of ordinary skill in the art that many more embodiments and implementations are possible that are within the scope of this invention.

What is claimed is:

1. A system for interfacing over a bus, the system comprising:
  a single-ended control interface coupled with a first power supply, and a common supply, wherein the control interface comprises a control driver configured to output a control output current to drive a control output signal, the control driver including a resistive bias circuit configured to track the control output current supplied to a switching unit through a current source thereby adjusting the performance of the control driver;
  a plurality of single-ended memory interfaces coupled to a second power supply and the common supply, each memory interface including a memory driver configured to output current to drive a memory output signal, wherein the control and memory output signals are driven to the common supply to transfer a logic low; and
  the bus being coupled to the single-ended control interface, between the switching unit and the resistive bias unit, and to the plurality of single-ended memory interfaces, the control output signal being the voltage level common to the switching unit and the resistive bias unit.

2. The system of claim 1, wherein the first power supply operates at a lower voltage than the second power supply.

3. The system of claim 1, wherein the common supply is ground.

4. The system of claim 1, wherein the memory driver comprises a resistive bias circuit configured to track the memory driver output current.

5. The system of claim 1, wherein the control interface comprises a control receiver configured to receive the memory output signal, and wherein the plurality of memory interfaces each comprise a memory receiver configured to receive the control output signal.

6. The system of claim 1, wherein the memory interface is a DRAM memory interface.

7. A memory interface circuit for transferring data, the interface comprising:
  a control driver configured to drive a control output signal, the control driver including:
    a current source coupled to a power supply, the current source configured to provide a control output current;
    a switching unit coupled to the current source, the switching unit configured to switch based on a control input signal; and
    a resistive bias unit coupled to the switching unit, the resistive bias unit configured to track the control output current supplied to the switching unit through the current source to adjust the performance of the control driver to maintain a constant control output signal, the switching unit and the resistive bias unit configured for coupling to a bus,
  wherein the control output signal is the voltage level common to the switching unit and resistive bias unit.

8. The interface circuit of claim 7, further comprising a pre-driver circuit configured to convert a differential data signal pair to the control input signal.

9. The interface circuit of claim 7, wherein the resistive bias unit comprises a sense amplifier, the sense amplifier configured to track the control output current.

10. The interface circuit of claim 7, wherein the switching unit comprises a P-type transistor.

11. The interface circuit of claim 7, wherein the bus is coupled with a plurality of memory drivers, each memory driver configured to drive a memory output signal, each memory driver comprising:
  a second current source coupled to a second power supply; and
  a second switching unit coupled to the second current source, the second switching unit configured to switch based on a memory input signal, the bus being coupled to the second switching unit, wherein the memory output signal is the voltage level output by the second switching unit.

12. A memory interface system for transferring data, the interface comprising:
   a control driver configured to drive a control output signal, the control driver including:
      a first current source coupled to a first power supply, the first current source configured to provide a control output current;
      a first switching unit coupled to the first current source, the first switching unit configured to switch based on a control input signal;
      a first resistive bias unit coupled to the first switching unit, the first resistive bias unit configured to track the control output current; and
   a plurality of memory drivers, each memory driver configured to drive a memory output signal, each memory driver comprising:
      a second current source coupled to a second power supply,
      a second pre-driver circuit configured to convert a second differential data signal pair to a memory input signal, and
      a second switching unit coupled to the second current source, the second switching unit configured to switch based on the memory input signal; and
   a bus being coupled to the control driver, between the first switching unit and the first resistive bias unit, and to the plurality of memory drivers, the control output signal being the voltage level common to the first switching unit and the first resistive bias unit, the bus being coupled with each of the second switching units of the plurality of memory drivers, wherein the memory output signal is the voltage level output by the second switching unit.

13. The interface system of claim 11, wherein the second switching unit comprises a P-type transistor.

14. A memory interface system, comprising:
   a memory control hub comprising a control unit configured to transfer data to a memory module comprising a plurality of memory units, wherein the data is transferred over a bus coupled to a termination resistor, the control unit including a control interface coupled to a first power supply and a common supply, the control interface including a control driver configured to provide control output current to drive a control output signal and a control receiver configured to receive a memory output signal, the control driver including a resistive bias circuit configured to track the control output current supplied to a switching unit through a current source thereby adjusting the performance of the control driver, the bus being coupled to the control unit, between the switching unit and the resistive bias circuit, and to the memory module, the control output signal being the voltage level common to the switching unit and the resistive bias circuit; and
   a plurality of memory interfaces, one memory interface for each of the memory units, each memory interface coupled to a second power supply, each memory interface including a memory driver configured to drive the memory output signal and a memory receiver configured to receive the control output signal, wherein the data transferred over the bus includes the control output signal and the memory output signal; and wherein the control output signal and memory output signal are driven to a voltage output high level to transfer a logic high, and the control output signal and memory output signal are driven to the common supply voltage to transfer a logic low.

15. The memory interface system of claim 14, wherein the common supply is set to ground.

16. The memory interface system of claim 14, wherein the control driver further comprises a resistive bias unit configured to track the control output current.

* * * * *